United States Patent [19]

Smith

[11] 3,984,680
[45] Oct. 5, 1976

[54] SOFT X-RAY MASK ALIGNMENT SYSTEM

[75] Inventor: Henry I. Smith, Sudbury, Mass.

[73] Assignee: Massachusetts Institute of Technology, Cambridge, Mass.

[22] Filed: Oct. 14, 1975

[21] Appl. No.: 622,108

[52] U.S. Cl. ............................... 250/272; 29/579; 250/492 A; 250/505
[51] Int. Cl.² ................... B01J 17/00; G21K 1/00; G21K 5/00; G01N 23/20
[58] Field of Search ............... 250/492 A, 393, 394, 250/505, 272; 156/16; 29/579

[56] References Cited
UNITED STATES PATENTS

| | | |
|---|---|---|
| 3,588,347 | 6/1971 | Montone et al. ............... 29/579 X |
| 3,742,229 | 6/1973 | Smith et al. ..................... 250/492 A |
| 3,742,230 | 6/1973 | Spears et al. .................... 250/505 |
| 3,743,842 | 7/1973 | Smith et al. ..................... 250/492 A |
| 3,892,973 | 7/1975 | Coquin ............................. 29/579 |

*Primary Examiner*—Alfred E. Smith
*Assistant Examiner*—T. N. Grigsby
*Attorney, Agent, or Firm*—Arthur A. Smith, Jr.; Martin M. Santa; Charles Hieken

[57] ABSTRACT

An alignment system for aligning one or more soft X-ray lithographic masks with respect to a substrate to be exposed in a soft X-ray lithographic apparatus includes alignment marks on the masks and corresponding alignment marks on a substrate, and a means for detecting X-rays emitted from the alignment marks on the substrate.

8 Claims, 4 Drawing Figures

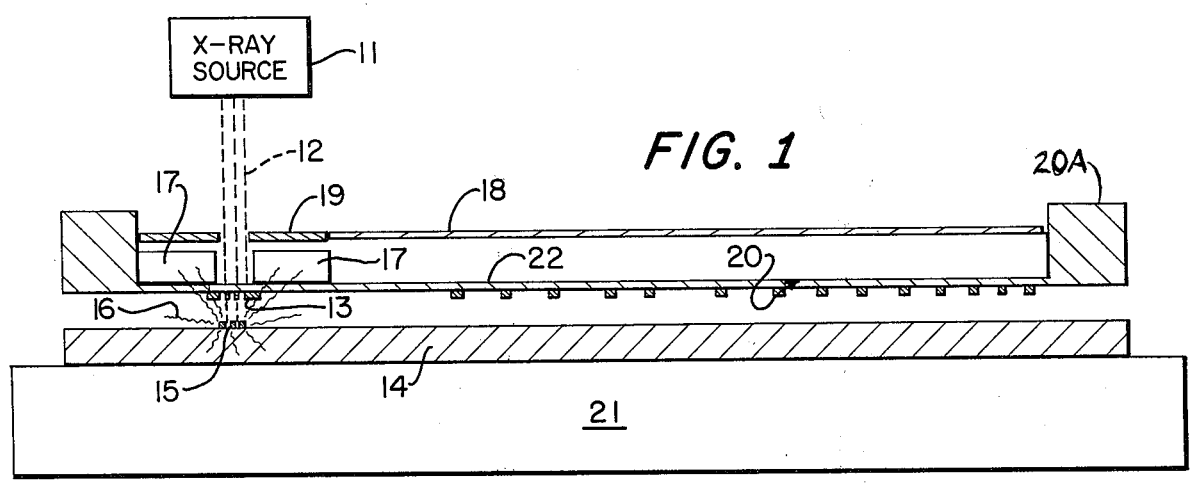
FIG. 1
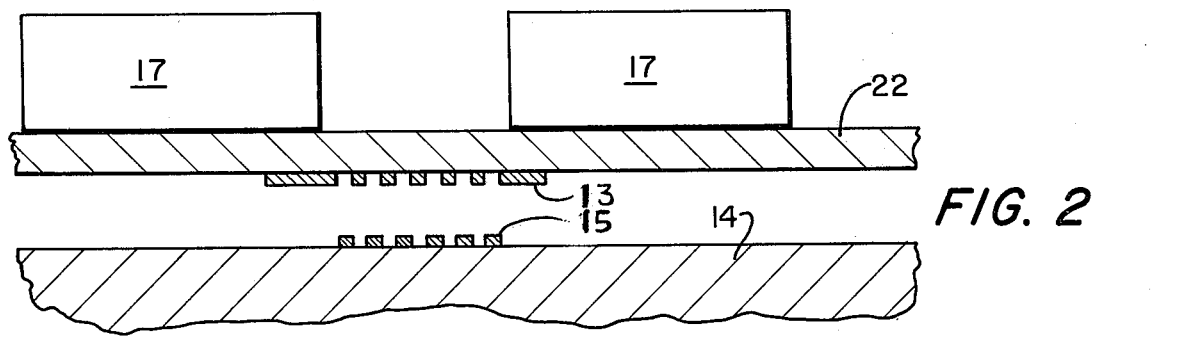
FIG. 2
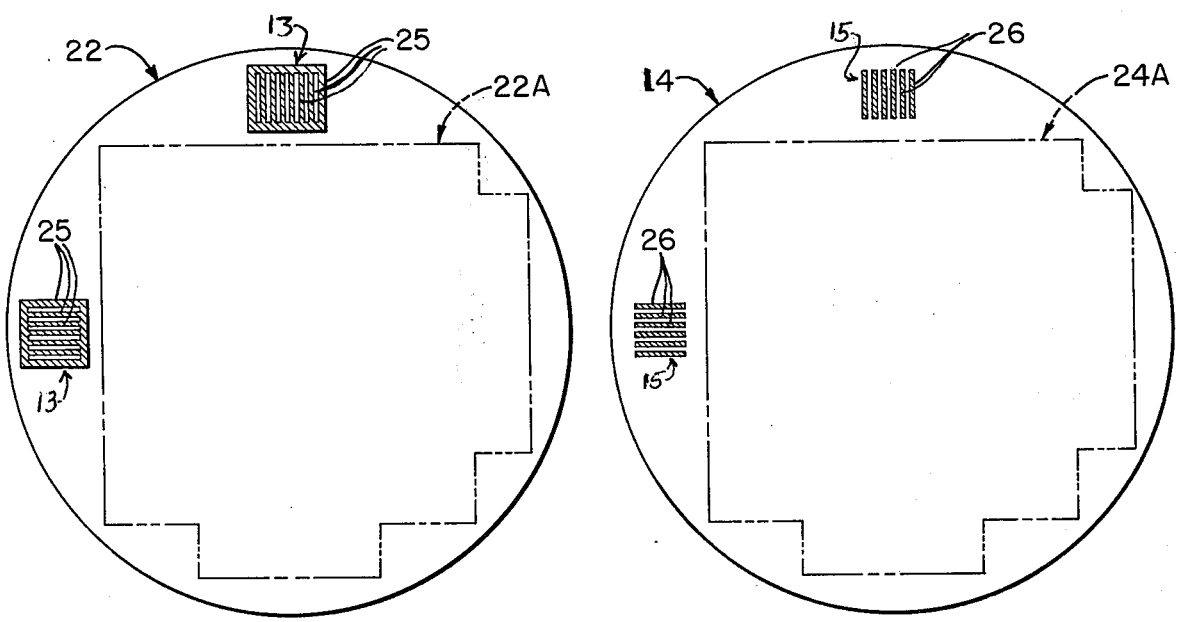
FIG. 3
FIG. 4

SOFT X-RAY MASK ALIGNMENT SYSTEM

The Government has rights in this invention pursuant to Contract F19628-73-C-002 awarded by the Department of the Air Force.

BACKGROUND OF THE INVENTION

This invention relates generally to alignment systems and more particularly to ensuring that each X-ray mask in a set of such masks is properly aligned with respect to a substrate to be exposed by X-ray lithography.

Soft X-ray lithography (see Soft X-Ray Lithographic Apparatus and Process, Smith et al., U.S. Pat. No. 3,743,842, July 3, 1973) has been shown to be an effective and convenient means of replicating high resolution patterns. This capability has been demonstrated by the replication in a polymer recording film of a repetitive grating with linewidths less than 180 nanometers. Soft X-ray lithography is also an effective and convenient means of fabricating microelectronic devices. In many fabrication procedures, several separate X-ray masks must be exposed on the same substrate, and the patterns produced by these several masks must be precisely superimposed. In many cases, extensive processing of the substrate occurs in between each X-ray exposure. Thus, a method for aligning the several X-ray masks with respect to a substrate is required. Optical alignment methods have been used successfully in the fabrication of MOS transistors (S. E. Bernacki and H. I. Smith, "Fabrication of Silicon MOS Devices Using X-Ray Lithography," IEEE Trans. ED, vol. ED22, pp. 421–428, July, 1975), but such optical means require that the soft X-ray mask be optically transparent, at least in certain regions. Moreover, in X-ray lithography it is desirable to have a finite separation between mask and substrate so as to avoid problems of mask and substrate damage. Separations of 10 to 30 micrometers are considered optimum, and at such separations, optical diffraction would prevent the achieving of the sub-micrometer superposition precision desired for X-ray lithography. A soft X-ray mask alignment system (see "Soft X-Ray Mask Alignment System," Smith et al., U.S. Pat. No. 3,742,229) has been patented that is based on the detection of soft x-rays transmitted through matching registration means on the X-ray mask and the substrate. This system does not require that the X-ray mask have optically transparent regions, and it can provide sub-micrometer superposition precision at mask-to-substrate separations of several micrometers. However, this system requires that the substrate be transparent to soft X-rays in the region behind the registration means on the substrate, so that X-rays can pass through the substrate to a soft X-ray sensor. This requirement that the substrate be transparent to soft X-rays in certain regions is a significant impediment to the commercial application of X-ray lithography. In the case of silicon substrates, in order to make certain regions soft X-ray transparent, the silicon in these regions must be reduced in thickness to about 30 micrometers. In the case of higher atomic number substrates, such as gallium arsenide or garnet, it would be necessary to drill holes entirely through the substrate and to support the substrate's registration means on thin, fragile membranes spanning the holes.

It is therefore an object of this invention to provide an alignment system for a soft X-ray lithographic apparatus which is capable of submicrometer superposition precision, and thus compatible with the high resolution capability of soft X-ray lithography.

It is a further object of this invention to provide such an alignment system which will function when the separation distance between the soft X-ray mask and the substrate exceeds several micrometers.

It is a further object of this invention to provide such an alignment system which will function when the substrate is opaque to soft X-rays.

It is a further object of this invention to provide such an alignment system which provides for precise superposition of each mask in a set of masks with a substrate to be exposed.

SUMMARY OF THE INVENTION

The invention features an alignment system for a soft X-ray lithographic apparatus capable of aligning soft X-ray masks with respect to substrates, and with respect to alignment marks on the substrates. There are first alignment marks on the mask having certain regions transparent to soft X-rays and other regions opaque to soft X-rays. There are second alignment marks on the substrate which are similar in geometric form to the first alignment marks which when struck with the X-rays used for alignment emit X-rays e.g. fluoresce. These emitted X-rays are then detected by means of a detector located away from the substrate in the direction of the mask. The magnitude of the detected signal, is simply related to the amount of superposition of the first and second alignment marks. This signal can therefore be used in an electro-mechanical feedback system to move the substrate or the mask so as to optimize the superposition.

Alternatively, the magnitude of the detected signal can be observed by a person who could then direct a means for mechanically moving the mask or substrate so as to optimize the superposition.

Soft X-ray exposing radiation for lithography comprises radiant energy in a spectrum between the vacuum UV (100–1000 Angstroms wavelength) and common X-ray (0.5–2 Angstroms wavelength) radiation bands. Absorbing and transmitting materials therefor are indicated in the above cited U.S. Pat. No. 3,743,842 of Smith et al. X-ray fluorescent materials and their emission characteristics are well known, per se, in the field of X-ray fluorescence analysis described, for example, in McGraw-Hill Encyclopedia of Science and Technology, Vol. 14, pp. 658–668 (McGraw-Hill, New York, 1971) and references cited therein.

Other objects, features and advantages will occur from the following description of a preferred embodiment and the accompanying drawing, in which,

BRIEF DESCRIPTION OF THE DRAWING

FIG. 1 is a diagrammatic cross-sectional view of a soft X-ray mask alignment system based on the detection of fluorescence X-rays emitted by substrate alignment marks;

FIG. 2 is an enlarged cross-sectional view of a portion of the mask and substrate shown in FIG. 1;

FIG. 3 is a diagrammatic plan view of the soft X-ray mask illustrating the alignment marks and pattern areas of a soft X-ray mask; and FIG. 4 is a diagrammatic plan view of a substrate illustrating the alignment marks and the substrate area allocated for patterns.

DETAILED DESCRIPTION OF PREFERRED EMBODIMENTS

Referring now to FIG. 1, the alignment of one or several masks relative to a substrate may be accomplished by emitting soft X-rays 12 from a source 11 such that soft X-rays pass through the soft X-ray transparent regions of alignment mark 13 and are strongly attenuated by the X-ray absorbing regions of alignment mark 13. U.S. Pat. Nos. 3,743,842 and 3,742,229 discuss the choices of material and thickness for the X-ray absorbing regions, as well as choices for the materials of the X-ray mask membrane 22 contained in a mask assembly 20 comprising the membrane and a supporting rim 20A). Because of the X-ray absorption by certain regions of the alignment mark 13, its X-ray shadow is cast onto the surface of the substrate 14 in the region of the substrate alignment mark 15. The substrate alignment mark 15 when struck by the incident X-rays 12 emits fluorescence X-rays 16 whose wavelength is characteristic of the material of which the substrate alignment marks 15 are made. Some of these fluorescence X-rays are in turn detected by the fluorescence X-ray detector 17. The number of fluorescence X-rays entering the detector 17 increases or decreases as the number of X-rays striking alignment mark 15 increases or decreases. Thus, the signal from the fluorescence X-ray detector can be directly related to the superposition of the X-ray shadow of alignment mark 13 onto alignment mark 15.

An X-ray shield 19 prevents X-rays emitted by X-ray source 11 from striking the fluorescence detector 17. An X-ray shield 18 prevents X-rays from source 11 from striking the substrate 14 in regions other than the substrate alignment mark 15. The shield 18 is used only during alignment and removed prior to the principal manufacturing step of X-ray exposure of the substrate.

The fluorescence X-ray detector 17 must be sensitive to soft X-rays and thus a wide variety of commercially available detectors could be used including solid state detectors, and proportional counters. Such detectors are described in the literature (N. A. Dyson, "X-rays in atomic and nuclear physics," Longman Group Limited, London 1973, pages 156 to 175).

Since the signal from the fluorescence X-ray detector increases or decreases in accordance with the superposition of the X-ray shadow of alignment mark 13 on substrate alignment mark 15, one can achieve alignment of mask and substrate alignment marks by observing the magnitude of the signal and moving the substrate using the substrate motion system 21, until the signal magnitude indicates optimum alignment. In addition to such manual alignment, an automatic alignment method, such as described in U.S. Pat. No. 3,742,229 and in the engineering literature (J. H. McCoy and P. A. Sullivan, "Progress in X-ray Lithography," Proceedings 6th Int. Conf. Electron and Ion Beam Science and Technology, R. Bakish, editor, Princeton, New Jersey: Electrochemical Society 1974), can be readily implemented, using the signal from the fluorescence detector in place of a signal from X-ray detectors located on the side of the substrate opposite from the X-ray source. The signals from the fluorescence detector may be directed to an electronic control system which would interpret the signals to determine the misalignment of the mask and substrate. This control system then directs the substrate motion system 21 to move the substrate so as to correct the misalignment.

In practice of the invention, the X-ray mask membrane 22 may be thin silicon about four micrometers thick, the soft X-ray absorber 13 may be gold about 350 nanometers thick, the X-ray source 11 may include an electron beam bombarding a silicon target at an electron energy of 10 to 20 KeV. The silicon target would emit primarily the silicon K line X-ray at a wavelength of 0.71 nanometers. The soft X-ray fluorescer 15 may be aluminum which when struck by the silicon K X-ray would emit a fluorescence X-ray of 0.834 nanometers wavelength. Those fluorescence X-rays which are emitted in the direction of the fluorescence detector 17 pass back through the silicon membrane 22 and are absorbed and detected in the fluorescence detector 17.

FIGS. 3 and 4 are diagrammatic plan views of the mask 22 and substrate 14, respectively, showing corresponding alignment marks 13 on the mask and 15 on the substrate. Marks 13 comprise parallel stripes 25 and marks 15 comprise parallel stripes 26. There are indicated at 22A and 24A, restricted areas for mask patterns and resultant substrate patterns. However, essentially all of the mask and substrate surfaces may be used for patterning if desired, excepting for the regions thereof reserved for alignment marking.

For alignment in two dimensions there would be at least two alignment marks 25 on the mask and two corresponding alignment marks 26 on the substrate. FIGS. 3 and 4 depict these as parallel stripes with the direction of one set of stripes perpendicular to the other. If these are respectively parallel to X and Y axes of motion of the substrate motion system 21, the interpretation of the signal from the detectors 17 is considerably simplified. For example, the signal from the detector associated with the alignment mark whose stripes run parallel to the x-direction would remain essentially unchanged for small motions in the x-direction, whereas the signal from the detector associated with the alignment mark having perpendicular stripes would change by a much larger amount. For motions in the Y direction, the situation would be reversed. Thus, independent alignment in X and Y directions is facilitated by alignment marks such as depicted in FIGS. 3 and 4. It will be understood that the foregoing principles will apply to other coordinate systems including, for instance, polar coordinates or an X-Y grid of 60° X-Y axis relation rather than 90°.

In order for the alignment of the mask and substrate alignment marks to result in a proper superposition on a substrate of patterns from several masks of a set, the patterns on these several masks must have a fixed spatial relationship to the mask alignment marks. There are several ways of achieving such a fixed spatial relationship. One such method is described in U.S. Pat. No. 3,742,229.

It is evident that those skilled in the art, once given the benefit of the foregoing disclosure, may now make numerous other uses and modifications of, and departures from the specific embodiments described herein without departing from the inventive concepts. For instance the stripes 25 of mark 13 (and/or stripes 26 of mark 15) can have coded, non-regular periodicity to enhance recognition of peak fluorescence corresponding to optimum alignment. The stripes 26 of marks 15 may comprise part of the substrate interrupted by etched pits, rather than using coatings of foreign material. Consequently, the invention is to be construed as embracing each and every novel feature and novel combination of features present in, or possessed by, the apparatus and techniques herein disclosed and limited solely by the scope and spirit of the appended claims.

What is claimed is:

1. Process for aligning closely spaced layers in a predetermined superposed relation comprising, placing first and second layers in closely spaced opposing relation, passing soft X-rays through a first one of said layers in a region thereof marked by a soft X-ray absorbing pattern to cast a soft X-ray shadow bombardment pattern on the second one of said layers, intercepting the soft X-ray shadowed radiation with soft X-ray responsive radiant energy emissive material located on said second layer, emitting radiant energy from said material in response to soft X-ray bombardment thereon and passing said radiant energy back through the first layer, and detecting said radiant energy 2. Aligning process in accordance with claim 1 wherein the radiant energy emissive material emits fluorescence X-rays in response to soft X-ray bombardment.

3. Aligning process in accordance with claim 1 and further comprising, adjusting the superposed relation of the layers to modify detected radiant energy emission from said second layer to establish a magnitude of emission corresponding to a desired degree of alignment between the superposed layers.

4. Aligning process in accordance with claim 3 wherein the desired degree of alignment corresponds to maximum radiant energy detection.

5. Apparatus for aligning at least first and second closely spaced layers in a predetermined superposed relation comprising, means defining an X-ray lithographic substrate as said second layer, means defining a shadow mask marked by a soft X-ray absorbing pattern as said first layer for intercepting and shadowing soft X-rays, means defining a soft X-ray source, means defining a radiant energy detector, the mask and substrate being spaced from each other by a distance of less than $10^{-4}$ meters and having front faces opposing each other, the source and detector being located behind the mask, said substrate being essentially opaque to soft X-rays, means defining at least one pair of corresponding aligning marks on the front faces of the substrate and mask comprising said soft X-ray absorbing pattern on the mask and radiant energy emitting material on the front face of the substrate.

6. Apparatus in accordance with claim 5 wherein each of the alignment marks comprises an array of parallel stripes.

7. Apparatus in accordance with claim 6 wherein at least two pairs of alignment marks are provided in the substrate and mask with the stripes of one pair of substrate/mask alignment marks being non-parallel to the stripes of a second pair.

8. Apparatus in accordance with claim 5 wherein the radiant energy detector comprises a detector of soft X-ray excited fluorescence from the radiant energy emitting material of the substrate aligning mark.

* * * * *